United States Patent
Sawada et al.

(10) Patent No.: US 9,461,451 B2
(45) Date of Patent: Oct. 4, 2016

(54) POWER CONVERTER WITH BUS BARS

(71) Applicant: DENSO CORPORATION, Kariya, Aichi-pref. (JP)

(72) Inventors: Hiroyoshi Sawada, Nagoya (JP); Makoto Okamura, Nisshin (JP)

(73) Assignee: DENSO CORPORATION, Kariya (JP)

( * ) Notice: Subject to any disclaimer, the term of this patent is extended or adjusted under 35 U.S.C. 154(b) by 110 days.

(21) Appl. No.: 14/290,021

(22) Filed: May 29, 2014

(65) Prior Publication Data

US 2014/0355221 A1 Dec. 4, 2014

(30) Foreign Application Priority Data

May 30, 2013 (JP) .................................. 2013-114357

(51) Int. Cl.
*H05K 7/14* (2006.01)
*H02G 5/02* (2006.01)
*H02M 7/00* (2006.01)

(52) U.S. Cl.
CPC ................ *H02G 5/02* (2013.01); *H02M 7/003* (2013.01); *H05K 7/1432* (2013.01)

(58) Field of Classification Search
None
See application file for complete search history.

(56) References Cited

U.S. PATENT DOCUMENTS

| 9,042,112 | B2 * | 5/2015 | Guan | H05K 7/1432 361/676 |
| 2008/0158824 | A1 * | 7/2008 | Aoki | H01L 23/24 361/711 |
| 2011/0261600 | A1 * | 10/2011 | Tachibana | H02M 7/003 363/131 |
| 2012/0006595 | A1 * | 1/2012 | Tachibana | H02M 7/003 174/74 R |
| 2013/0058068 | A1 * | 3/2013 | Funatsu | H05K 7/20927 361/820 |
| 2013/0121052 | A1 * | 5/2013 | Yamaura | H02M 7/003 363/131 |

FOREIGN PATENT DOCUMENTS

| JP | 2006-295997 | 10/2006 |
| JP | 2011-109767 | 6/2011 |
| JP | 2011-172469 | 9/2011 |
| JP | 2012-249452 | 12/2012 |
| JP | 5655846 | 1/2015 |

* cited by examiner

*Primary Examiner* — Courtney Smith
(74) *Attorney, Agent, or Firm* — Nixon & Vanderhye P.C.

(57) ABSTRACT

A power converter is equipped with a semiconductor module stack, a positive bus bar stack, and a negative bus bar stack. The positive bus bar stack has a first positive bus bar and a second positive bus bar stacked. The negative bus bar stack also has a first negative bus bar and a second negative bus bar stacked in a stacking direction Z of the positive bus bar stack. The first semiconductor modules of the semiconductor module stack are connected to the first positive bus bar and the first negative bus bar, while the second semiconductor modules of the semiconductor module stack are connected to the second positive bus bar and the second negative bus bar. This results in a decreased variation in mutual inductance among the semiconductor modules, which leads to a decrease in overall inductance of the power converter.

3 Claims, 16 Drawing Sheets

POWER CONVERTER WITH BUS BARS

CROSS REFERENCE TO RELATED DOCUMENT

The present application claims the benefit of priority of Japanese Patent Application No. 2013-114357 filed on May 30, 2013, the disclosure of which is incorporated herein by reference.

TECHNICAL FIELD

The present invention generally relates to a power converter with a bus bar.

BACKGROUND ART

There are power converters which are to be mounted in electric vehicles or hybrid vehicles and in which a plurality of semiconductor modules are connected to other electric devices through bus bars. For instance, Japanese Patent First Publication No. 2006-295997 discloses a power converter with a single bus bar which is formed by punching out a metallic plate and equipped with a plurality of connecting terminals joined to connecting terminals of a stack of semiconductor modules.

However, the above described power converter is designed to have the plurality of connecting terminals formed a single metallic plate and connected to the stack of the semiconductor modules, thus causing the distance between the adjacent connecting terminals of the bus bar to be decreased with a decrease in distance between adjacent two of the semiconductor modules. The decrease in distance between the adjacent connecting terminals of the bus bar made of the single metal plate will restrict the size of each of connections of the connecting terminals. This results in a lack of the connections of the connecting terminals to the connecting terminals of the semiconductor modules.

The above problem may be solved by use of a stack of bus bars which are formed by a plurality of metallic plates. For instance, a bus bar stack is formed which is made up of a plurality of bus bars and has connecting terminals adjacent ones of which extend from the different bars of the bus bar stack. This permits the distance between the adjacent connecting terminals to be increased to widen the connections of the connecting terminals.

However, the inductance of semiconductor modules which are joined to the outer two of the stack of the bus bars is different from that of semiconductor modules which are joined to the inner two of the stack of the bus bars. This arises from a difference in effect of mutual inductance between the bus bars joined to the semiconductor modules. The surge voltage on the whole of the power converter depends upon the highest inductance. A problem is, therefore, encountered in that the difference in inductance between circuits of the semiconductor modules, therefore tends to undesirably increase the inductance of the whole of the power converter.

The invention was made in view of the above problems to provide a power converter which decreases a variation in effect of the mutual inductance among a plurality of semiconductor modules, thereby decreasing the inductance of the whole of the power converter.

SUMMARY

One aspect of the present invention is a power converter which comprises: a semiconductor module stack made up a plurality of semiconductor modules constituting a portion of a power converting circuit; a positive bus bar stack made up of a plurality of positive bus bars which include plate-like positive bus bar bodies and a plurality of positive connecting terminals extending from the positive bus bar bodies to connect with positive terminals of said semiconductor modules, the positive bus bar bodies being laid on each other; and a negative bus bar stack made up of a plurality of negative bus bars which include plate-like negative bus bar bodies and a plurality of negative connecting terminals extending from the negative bus bar bodies to connect with negative terminals of said semiconductor modules, the negative bus bar bodies being laid on each other.

The semiconductor moduel stack includes first semiconductor modules and second semiconductor modules which are stacked with extending directions of the positive terminals and the negative terminals being identical with each other.

The positive bus bars of the positive bus bar stack include a first positive bus bar and a second positive bus bar which are stacked in a direction perpendicular to a stacking direction of the first semiconductor modules and the second semiconductor modules.

The negative bus bars of the negative bus bar stack include a first negative bus bar and a second negative bus bar which are stacked in the stacking direction of the first positive bus bar and the second positive bus bar.

The first positive bus bar and the first negative bus bar are connected to the positive terminals and the negative terminals of the first semiconductor modules, respectively. The second positive bus bar and the second negative bus bar are connected to the positive terminals and the negative terminals of the second semiconductor modules, respectively.

In the power converter, the direction and order in which the first positive bus bar and the second positive bus bar of the positive bus bar stack are stacked are identical with those in which the first negative bus bar and the second negative bus bar of the negative bus bar stack are stacked. The first positive bus bar is connected to the positive terminals of the first semiconductor modules of the semiconductor module stack. The first negative bus bar is connected to the negative terminals of the first semiconductor modules. The second positive bus bar is connected to the positive terminals of the second semiconductor modules. The second negative bus bar is connected to the negative terminals of the second semiconductor modules. Specifically, the positive terminal and the negative terminal of one of the semiconductor modules are respectively connected to one of the positive bus bars of the positive bus bar stack and one of the negative bus bars of the negative bus bar stack which are identical in stacking order in the positive bus bar stack and the negative bus bar stack. This equalizes the distance between the positive connecting terminals of the first positive bus bar of the first semiconductor modules and the negative connecting terminals of the first negative bus bar of the first semiconductor modules to the distance between the positive connecting terminals of the second positive bus bar of the second semiconductor modules and the negative connecting terminals of the second negative bus bar of the second semiconductor modules. This results in a decreased difference between the effect of the mutual inductance in the first semiconductor modules and that in the second semiconductor modules. In other words, a variation in mutual inductance among the semiconductor modules is decreased, thereby decreasing the overall inductance of the power converter.

As described above, the power converter is provided which decreases a variation in effect of the mutual inductance among a plurality of semiconductor modules, thereby decreasing the inductance of the whole of the power converter.

DESCRIPTION OF EMBODIMENT (First Embodiment)

The power converter 1 of the first embodiment will be described using FIGS. 1 to 16. The power converter 1 may be used as an inverter mounted in, for example, electric vehicles or hybrid vehicles.

Figure 1:
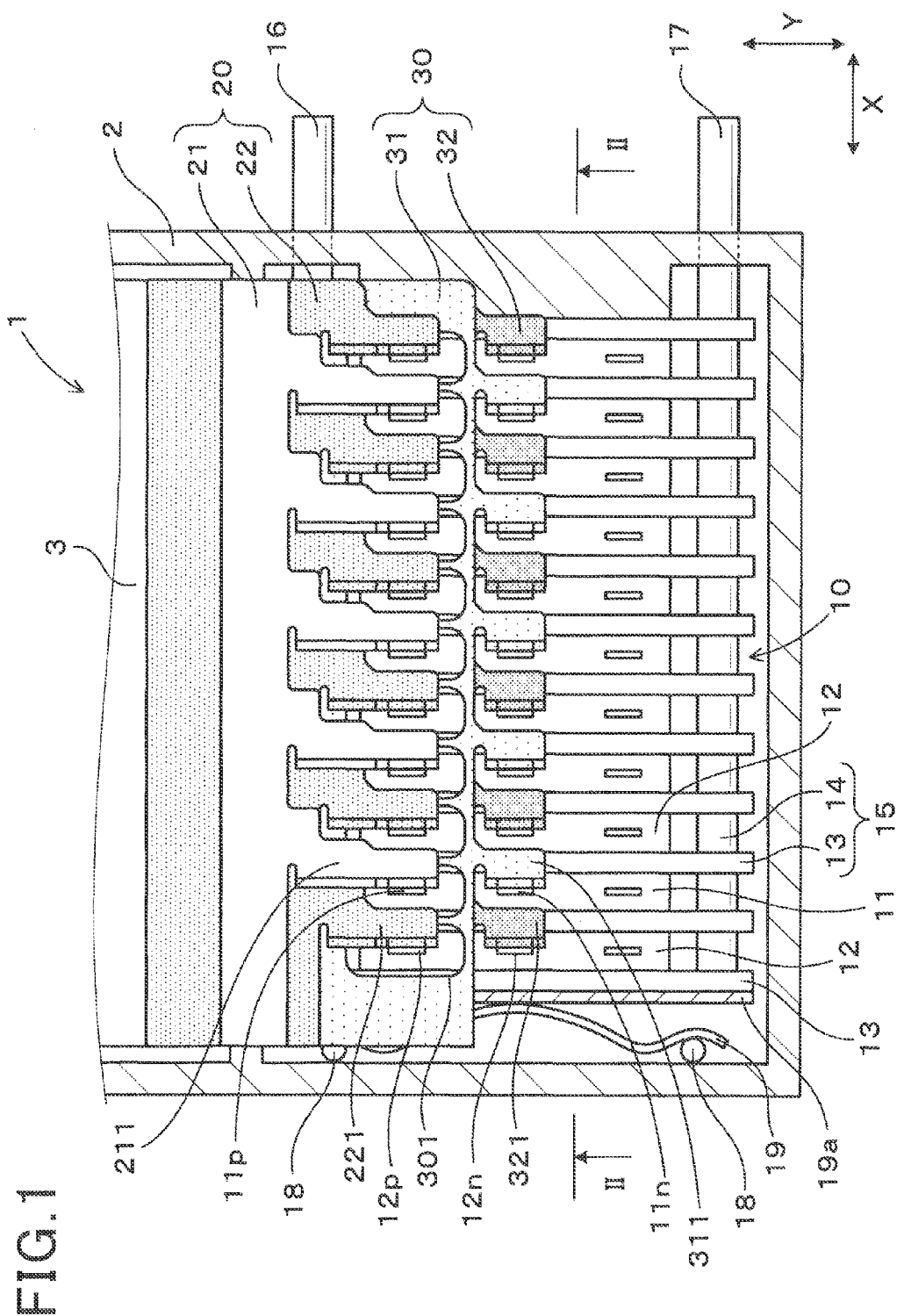
FIG. 1 is a plane view of a power converter in the first embodiment.

The power converter 1 is, as illustrated in FIG. 1, equipped with a semiconductor module stack 10, a positive bus bar stack 20, and a negative bus bar stack 30.

The semiconductor module stack 10 is made up of a plurality of semiconductor modules (i.e., first semiconductor modules 11 and second semiconductor modules 12) which constitute a portion of a power converting circuit.

Figure 2:
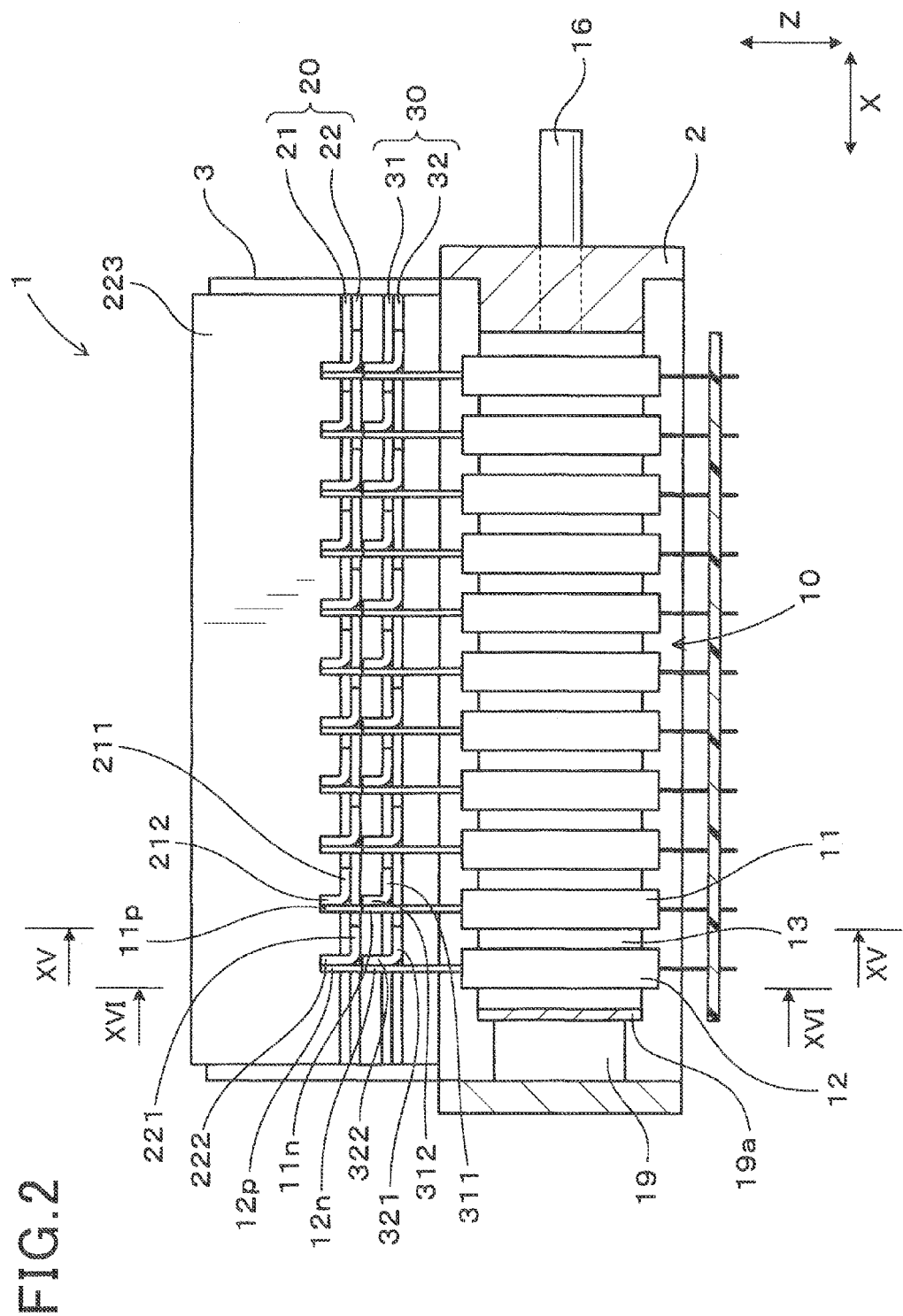
FIG. 2 is a sectional view, as taken along the line II-II in FIG. 1.

The first semiconductor modules 11 and the second semiconductor modules 12 are, as illustrated in FIG. 2, stacked in an X-direction (which will also be referred to as a stacking direction X below) with extending directions Z of positive terminals 11p and 12p and negative terminals 11n and 12n being identical with each other.

The semiconductor module stack 10 is, as illustrated in FIGS. 1 and 2, retained by a metallic frame 2. The first semiconductor modules 11 and the second semiconductor modules 12 are arranged alternately. The cooling pipes 13 are each disposed between the first semiconductor modules 11 and the second semiconductor modules 12. They are laid on each other in the stacking direction X perpendicular to the extending direction Z. The frame 2 has a pair of supporting pins 18 disposed therein. The semiconductor module stack 10 is pressed by a pressing member 19 which is implemented by a plate spring retained by the supporting pins 18 against an inner wall of the frame 2. A reinforcement plate 19a is disposed between the pressing member 19 and the semiconductor module stack 10 to distribute the pressure produced by the pressing member 19.

The cooling pipes 13 are in the shape of a plate and have refrigerant paths formed therein. The cooling pipes 13, as can be seen in FIG. 1, have a length extending in a direction Y that is perpendicular to the extending direction Z and the stacking direction X. Every adjacent two of the cooling pipes 13 are joined together at ends thereof in the direction Y by a connecting pipe 14 which is deformable. The cooing pipes 13 and the connecting pipes 14 constitute a cooler 15. The refrigerant inlet pipe 16 and the refrigerant outlet pipe 17 are joined to the cooling pipe 13 disposed on one of ends of the cooler 15 in the stacking direction X. The refrigerant flows through the cooler 15 to cool the first semiconductor modules 11 and the second semiconductor modules 12.

Figure 3:
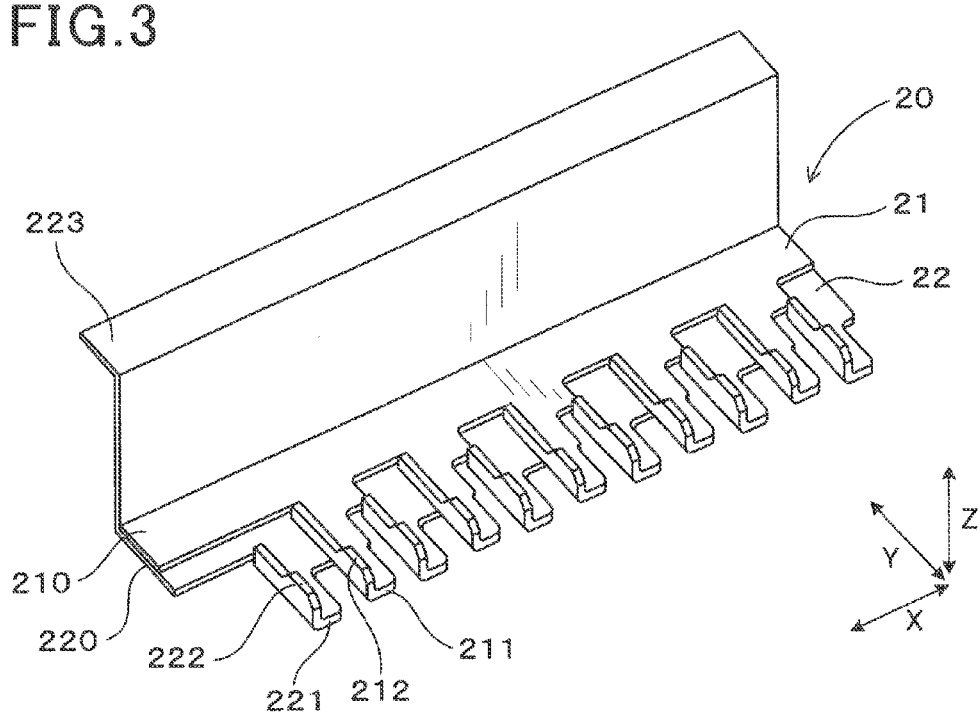
FIG. 3 is a perspective view of a positive bus bar stack in the first embodiment.

The positive bus bar stack 20 is, as illustrated in FIG. 3, made up of a plurality of positive bus bars (a first positive bus bar 21 and a second positive bus bar 22). The first positive bus bar 21 and the second positive bus bar 22 are laid on each other in a direction Z perpendicular to the stacking direction X of the first semiconductor modules 11 and the second semiconductor modules 12.

Figure 4:
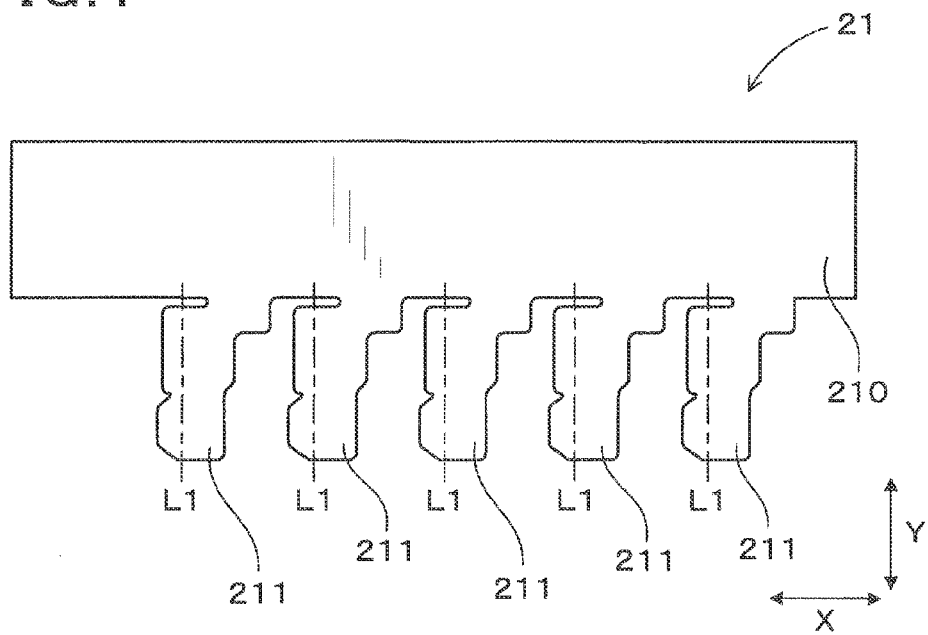
FIG. 4 is a plane view of a first positive bus bar before positive connecting terminals are bent in the first embodiment.

The first positive bus bar 21 is, as illustrated in FIG. 4, equipped with a plate-like positive bus bar body 210 and a plurality of positive connecting terminals 211 which extend from the positive bus bar body 210 to connect with positive terminals 11p of the semiconductor modules 11 (FIG. 1).

Figure 5:
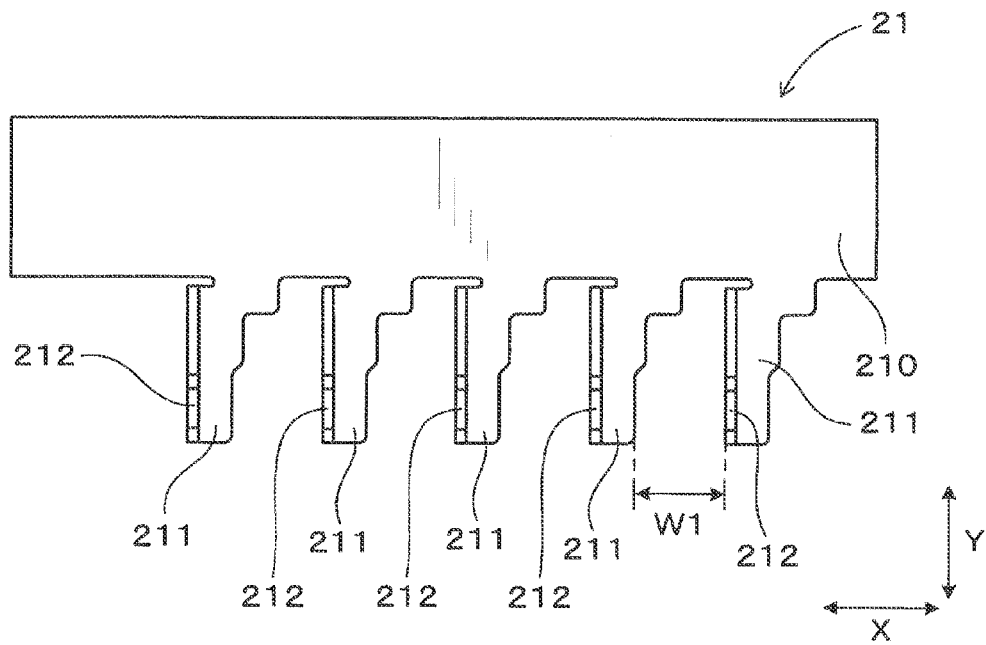
FIG. 5 is a plane view of the first positive bus bar after the positive connecting terminals of the first positive bus bar are bent in FIG. 4.

The positive bus bar body 210 is, as illustrated in FIGS. 3 and 4, in the shape of an elongated plate extending in the stacking direction X of the semiconductor module stack 10. The positive connecting terminals 211 extend from the long side of the positive bus bar body 210 in the direction Y perpendicular to the directions X and Z and are equally spaced from each other in the direction X. This embodiment is equipped with the five positive connecting terminals 211. The positive connecting terminals 211 are, as illustrated in FIGS. 2 and 5, bent parallel to the direction Z at locations, as indicated by broken lines L1 parallel to the direction Y in FIG. 4, toward the opposite side of the semiconductor module stack 10, thereby forming a bent end 212 on each of the positive connecting terminals 211 which extends in the direction Z. Each of the bent ends 212 is, as illustrated in FIG. 5, spaced away from the adjacent bent end 212 and the positive connecting terminal 211 by a distance W1.

Figure 6:
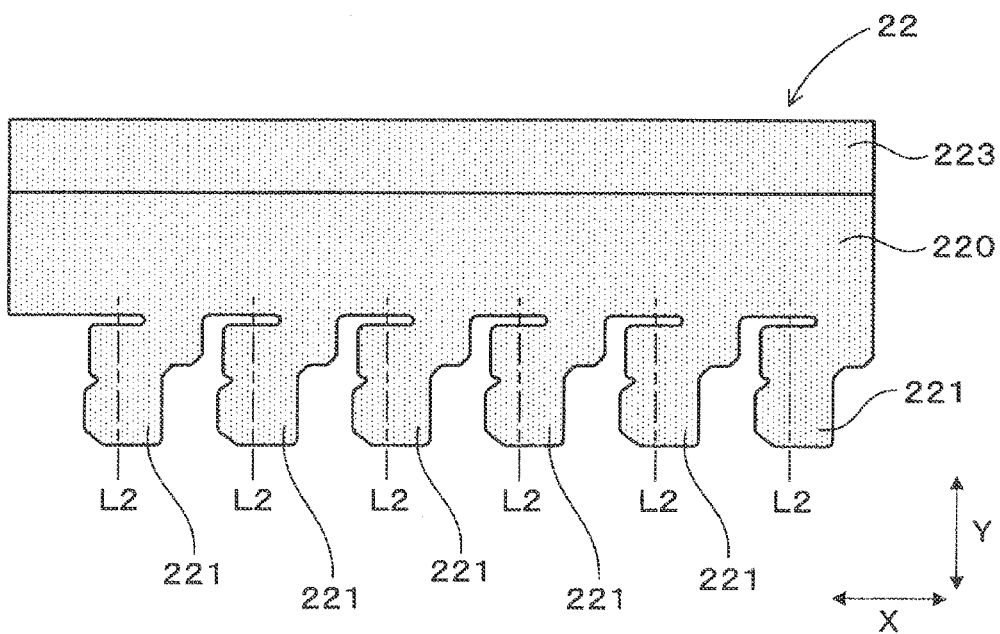
FIG. 6 is a plane view of a second positive bus bar before positive connecting terminals are bent in the first embodiment.

The second positive bus bar 22 is, as illustrated in FIG. 6, equipped with a plate-like positive bus bar body 220 and a plurality of positive connecting terminals 221 which extend from the positive bus bar body 220 to connect with positive terminals 12p (FIG. 1) of the second semiconductor modules 12. The second positive bus bar 22 also includes a capacitor connector 223 which is joined to the capacitor 3, as will be described later.

Figure 7:
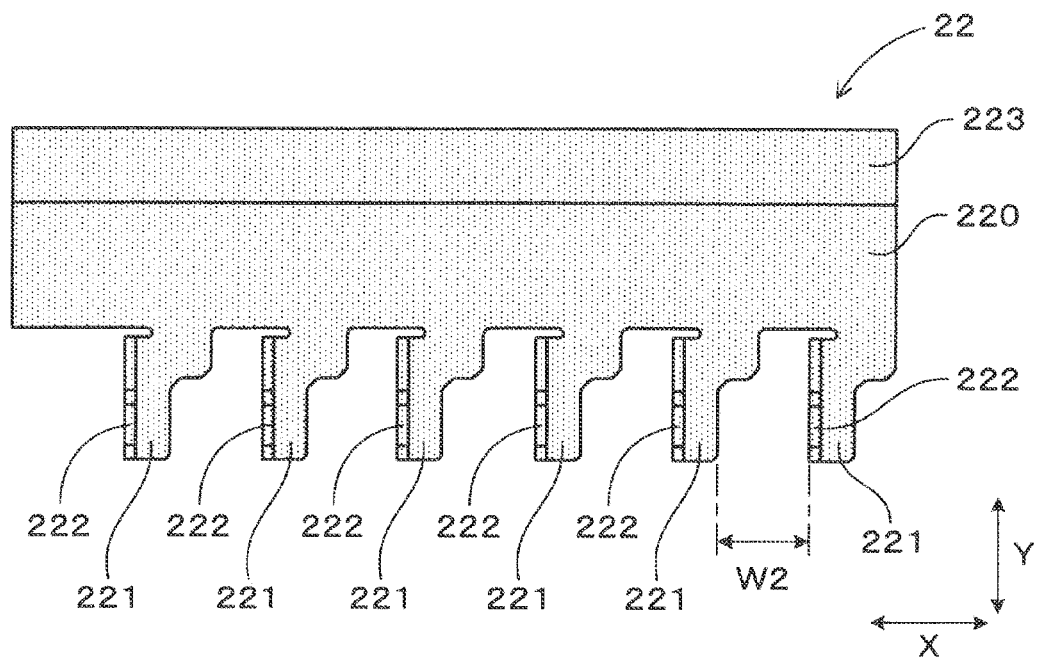
FIG. 7 is a plane view of the second positive bus bar after the positive connecting terminals are bent in FIG. 6.

Like the positive bus bar body 210 (FIG. 4), the positive bus bar body 220 is, as illustrated in FIGS. 3 and 6, in the shape of an elongated plate extending in the stacking direction X of the semiconductor module stack 10. The positive connecting terminals 221, like the positive connecting terminals 211 (FIG. 4), extend from the long side of the positive bus bar body 220 in the direction Y perpendicular to the directions X and Z and are equally spaced from each other in the direction X. In this embodiment, there are six positive connecting terminals 211. The positive connecting terminals 211 are, as illustrated in FIGS. 2 and 7, bent parallel to the direction Z at locations, as indicated by broken lines L2 parallel to the direction Y in FIG. 6, toward the opposite side of the semiconductor module stack 10, thereby forming a bent end 222 on each of the positive connecting terminals 221 which extends in the direction Z. Each of the bent ends 222 is, as illustrated in FIG. 7, spaced away from the adjacent bent end 222 and the positive connecting terminal 221 by a distance W2.

The capacitor connector 223 is in the shape of a plate and formed on the opposite side of the positive connecting terminals 221. The capacitor connector 223 is bent into an L-shape in cross section along a side wall of the capacitor 3.

Figure 8:
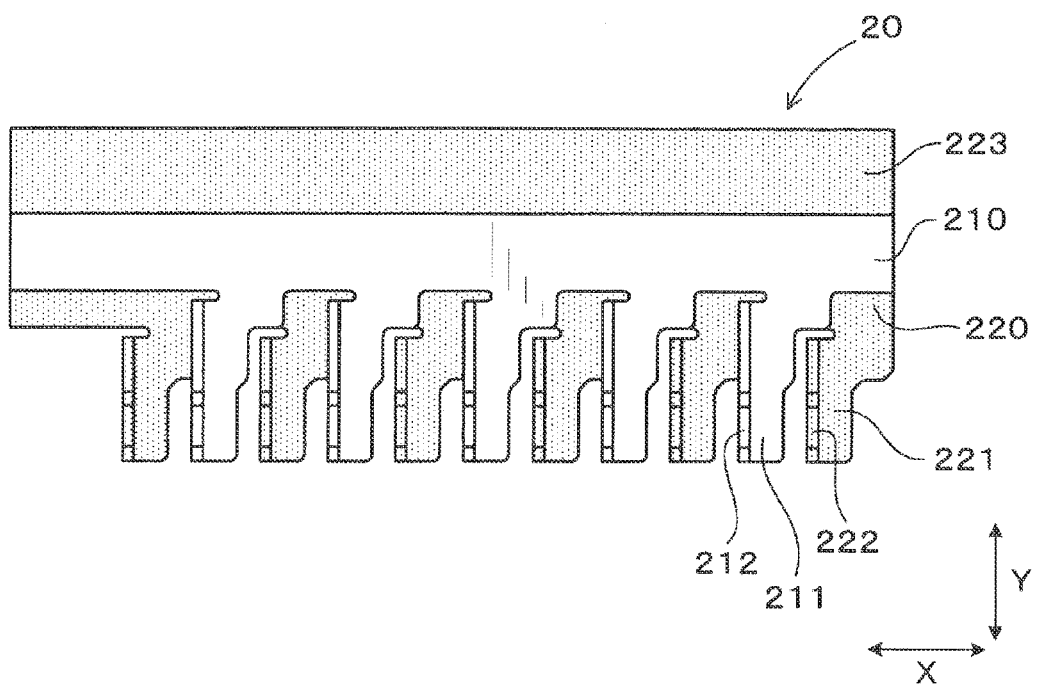
FIG. 8 is a top view of a positive bus bar stack in the first embodiment.

The first positive bus bar 21 and the second positive bus bar 22 of the positive bus bar stack 20 are, as illustrated in FIGS. 3 and 8, laid on each other with the positive bus bar bodies 210 and 220 overlapping each other. The first positive bus bar 21 and the second positive bus bar 22 are arranged in this order toward the semiconductor module stack 10 in the direction Z perpendicular to the stacking direction X of the semiconductor module stack 10. The first positive bus bar 21 and the second positive bus bar 22 are joined together by bolts not shown and connected electrically. The positive connecting terminals 211 and the positive connecting terminals 221 are, as shown in FIG. 8, arranged alternately in the direction X and do not overlap each other, as viewed from the direction Z. This causes one of the bent ends 212 of the first positive bus bar 21 of the positive bus bar stack 20 to be, as illustrated in FIG. 8, disposed next to at least one of the bent ends 222 of the second positive bus bar 22 (i.e., the two neighbor bent ends 222 in the direction X in this embodiment).

The positive bus bar stack 20, as illustrated in FIG. 8, has the positive connecting terminals 211 and 221 whose ends in the direction Y are aligned with each other. The bent ends 212 and 222, as can be seen in FIG. 2, have ends which are opposed to the semiconductor module stack 10 in the direction Z and aligned with each other (i.e., heights thereof in the direction Z are aligned with each other).

Figure 9:
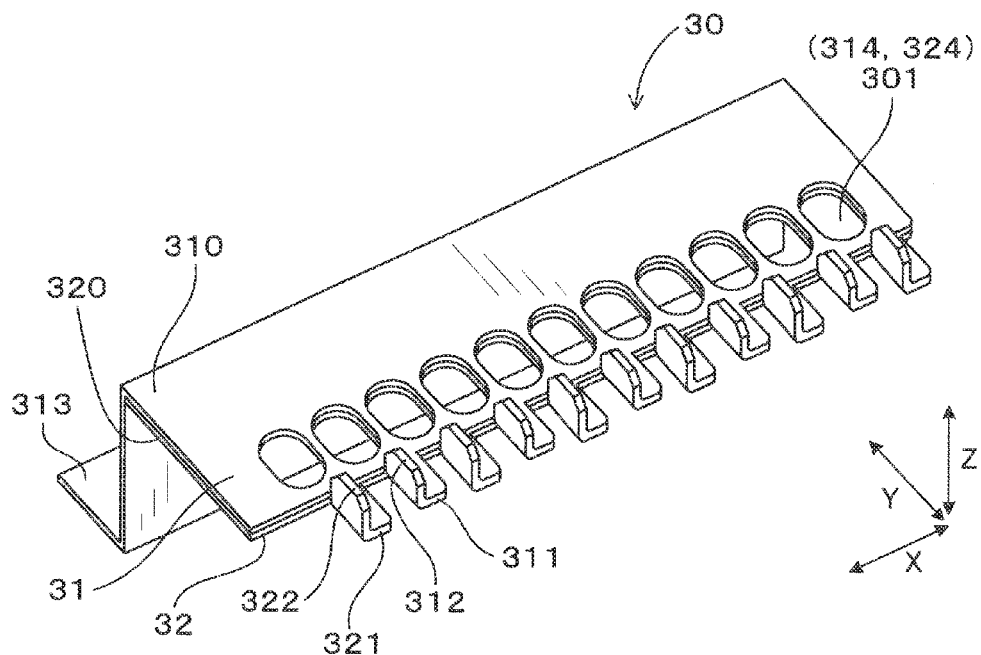
FIG. 9 is a perspective view of a negative bus bar stack in the first embodiment.

The negative bus bar stack 30 is, as illustrated in FIG. 9, made up of a plurality of negative bus bars (a first negative bus bar 31 and a second negative bus bar 32). The first negative bus bar 31 and the second negative bus bar 32 are laid on each other in the stacking direction Z of the first positive bus bar 21 and the second positive bus bar 22.

Figure 10:
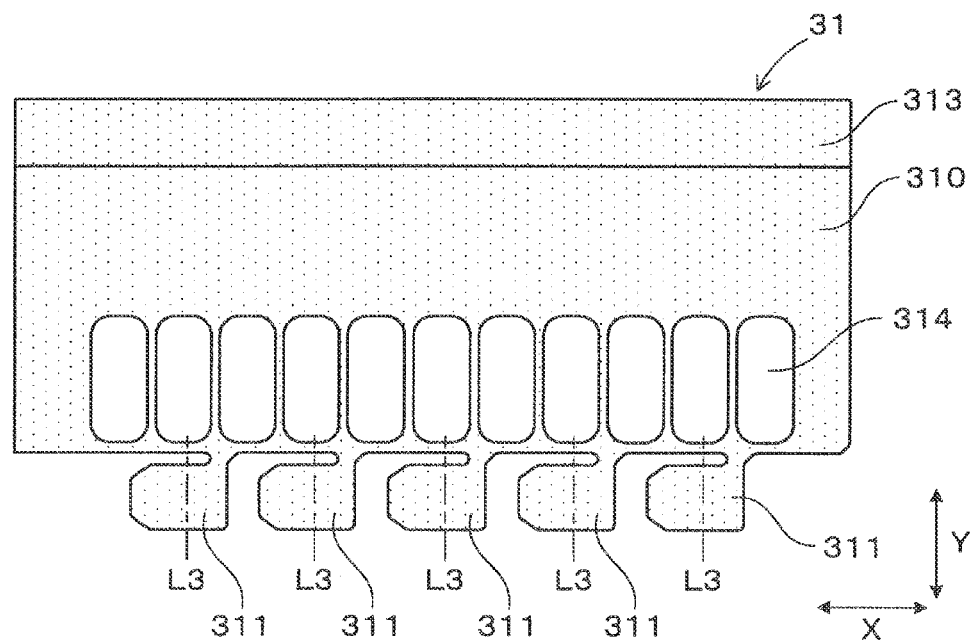
FIG. 10 is a plane view of a first negative bus bar before negative connecting terminals are bent in the first embodiment.

The first negative bus bar 31 is, as illustrated in FIGS. 9 and 10, equipped with a plate-like negative bus bar body 310 and a plurality of negative connecting terminals 311 which extend from the negative bus bar body 310 to connect with negative terminals 11n of the semiconductor modules 11 (FIG. 1). The first negative bus bar 31 also includes a capacitor connector 313 which is joined to the capacitor 3, as will be described later.

Figure 11:
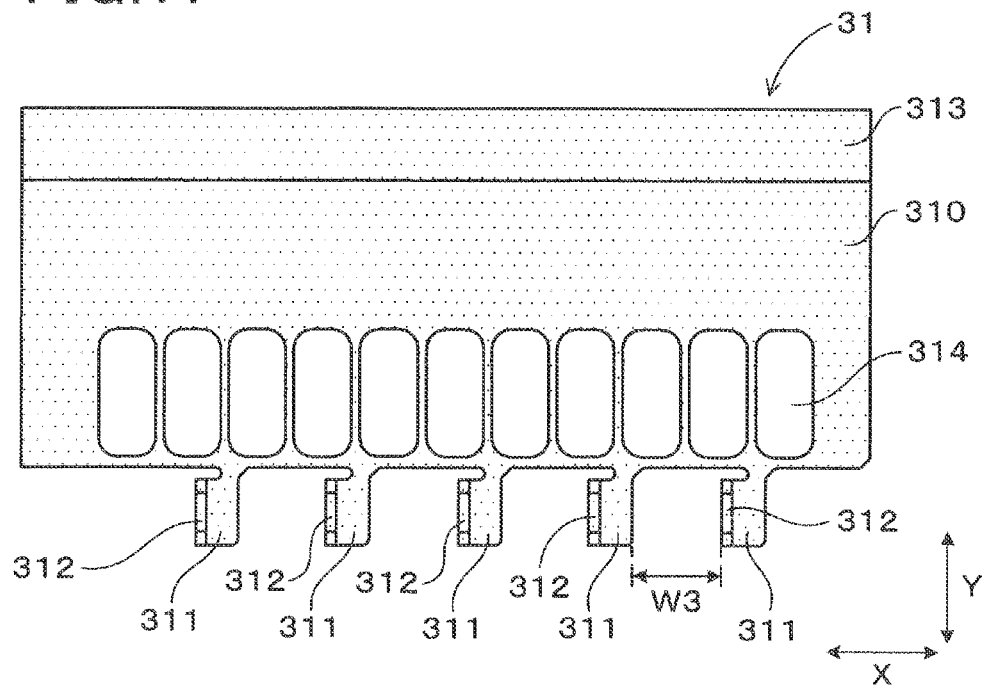
FIG. 11 is a plane view of the first negative bus bar after the negative connecting terminals are bent in FIG. 10.

The negative bus bar body 310 is in the shape of an elongated plate extending in the stacking direction X. The negative connecting terminals 311, as illustrated in FIG. 10, extend from the long side of the negative bus bar body 310 in the direction Y and are equally spaced from each other in the direction X. In this embodiment, there are five negative connecting terminals 311. The negative connecting terminals 311 are, as illustrated in FIGS. 2 and 11, bent parallel to the direction Z at locations, as indicated by broken lines L3 parallel to the direction Y in FIG. 10, toward the opposite side of the semiconductor module stack 10, thereby forming a bent end 312 on each of the negative connecting terminals 311 which extends in the direction Z. Each of the bent ends 312 is, as illustrated in FIG. 11, spaced away from the adjacent bent end 312 and the negative connecting terminal 311 by a distance W3.

The capacitor connector 313 is in the shape of a plate and formed on the opposite side of the negative connecting terminals 311 of the negative bus bar body 310. The capacitor connector 313 is bent into an L-shape in cross section along the side wall of the capacitor 3.

The negative bus bar body 310, as illustrated in FIG. 10, has through holes 314 formed at locations facing the positive poles 11p of the first semiconductor modules 11 and the positive poles 12p of the second semiconductor modules 12. The through holes 314 are holes elongated in the direction Y.

Figure 12:
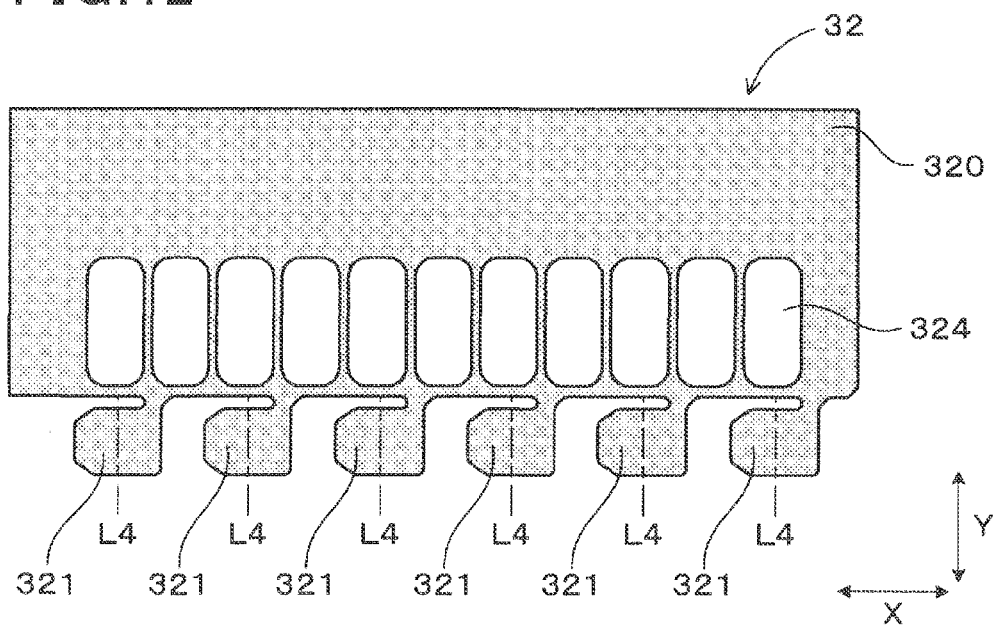
FIG. 12 is a plane view of a second negative bus bar before negative connecting terminals are bent in the first embodiment.

The second negative bus bar 32 is, as illustrated in FIG. 12, equipped with a plate-like negative bus bar body 320 and a plurality of negative connecting terminals 321 which extend from the negative bus bar body 320 to connect with the negative terminals 12p of the second semiconductor modules 12 (FIG. 1).

Figure 13:
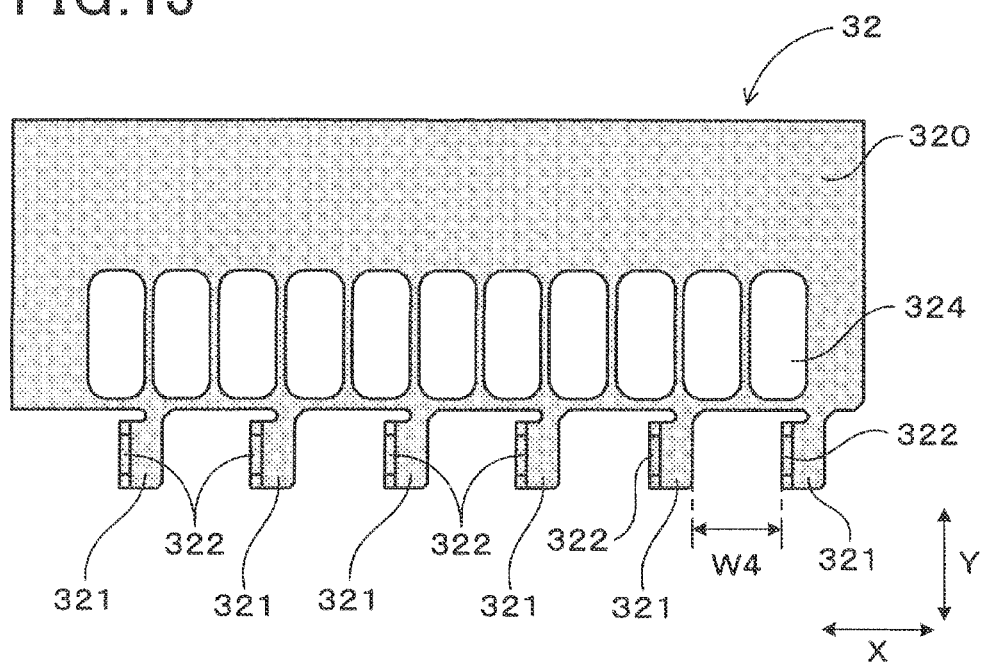
FIG. 13 is a plane view of the second negative bus bar after the negative connecting terminals are bent in FIG. 12.

Like the negative bus bar body 310 (FIG. 10), the negative bus bar body 320 is, as illustrated in FIGS. 9 and 12, in the shape of an elongated plate extending in the stacking direction X of the semiconductor module stack 10. The negative connecting terminals 321, like the negative connecting terminals 311 (FIG. 10), extend from the long side of the negative bus bar body 320 in the direction Y and are equally spaced from each other in the direction X. In this embodiment, there are six negative connecting terminals 321. The negative connecting terminals 321 are, as illustrated in FIGS. 2 and 13, bent parallel to the direction Z at locations, as indicated by broken lines L4 parallel to the direction Y in FIG. 12, toward the opposite side of the semiconductor module stack 10, thereby forming a bent end 322 on each of the negative connecting terminals 321 which extends in the direction Z. Each of the bent ends 322 is, as illustrated in FIG. 13, spaced away from the adjacent bent end 322 and the negative connecting terminal 321 by a distance W4.

The negative bus bar body 320, as illustrated in FIG. 13, has through holes 324 formed at locations facing the positive poles 11p of the first semiconductor modules 11 and the positive poles 12p of the second semiconductor modules 12. The through holes 314 are identical in shape with the through holes 314 (FIG. 11).

Figure 14:
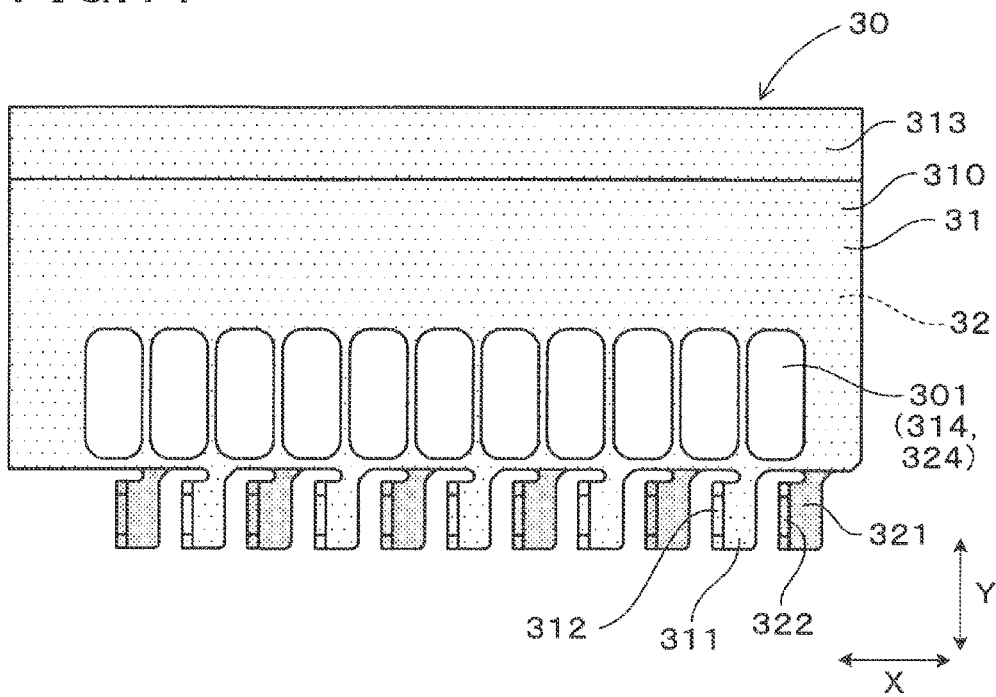
FIG. 14 is a top view of a negative bus bar stack in the first embodiment.

The first negative bus bar 31 and the second negative bus bar 32 of the negative bus bar stack 30 are, as illustrated in FIGS. 9 and 14, laid on each other with the negative bus bar bodies 310 and 320 overlapping each other. The first negative bus bar 31 and the second negative bus bar 32 are arranged in this order toward the semiconductor module stack 10 in the direction Z perpendicular to the stacking direction X of the semiconductor module stack 10. The first negative bus bar 31 and the second negative bus bar 32 are joined together by bolts not shown and connected electrically. The negative connecting terminals 311 and the negative connecting terminals 321 are, as shown in FIG. 9, arranged alternately in the direction X and do not overlap each other, as viewed from the direction Z. This causes one of the bent ends 312 of the first negative bus bar 31 of the negative bus bar stack 30 to be, as illustrated in FIG. 14, disposed next to at least one of the bent ends 322 of the second negative bus bar 32 (i.e., the two neighbor bent ends 322 in the direction X in this embodiment).

The negative bus bar stack 20, as illustrated in FIG. 2, has the bent ends 312 and 322 whose ends opposed to the semiconductor module stack 10 in the direction Y are aligned with each other. The bent ends 312 and 322, as can be seen in FIG. 2, have ends which are opposed to the semiconductor module stack 10 in the direction Z and aligned with each other (i.e., heights thereof in the direction Z are aligned with each other).

The through holes 314 and 324 coincide with each other to form, as illustrated in FIGS. 1 and 9, through holes 301 in the negative bus bar stack 30.

The capacitor 3 is disposed adjacent the semiconductor module stack 10 in the direction Y. The capacitor 3 has a positive terminal (not shown) at one of ends in the direction X (i.e., on the side where the positive terminals 11p and 12p and the negative terminals 11n and 12n of the semiconductor module stack 10 extend) and a negative terminal (not shown) on the other end. The positive terminal of the capacitor 3 is connected to the capacitor connector 223 of the positive bus bar stack 20. The negative terminal of the capacitor 3 is connected to the capacitor connector 313 of the negative bus bar stack 30. This establishes an electric connection of the capacitor 3 to the semiconductor module stack 10 through the positive bus bar stack 20 and the negative bus bar stack 30.

The function effects of the power converter 1 will be described below in detail.

The direction and order in which the first positive bus bar 21 and the second positive bus bar 22 of the positive bus bar stack 20 are stacked are identical with those in which the first negative bus bar 31 and the second negative bus bar 32 of the negative bus bar stack 30 are stacked. The first positive bus bar 21 is connected to the positive terminals 11p of the first semiconductor modules 11 of the semiconductor module stack 10. The first negative bus bar 31 is connected to the negative terminals 11n of the first semiconductor modules 11. The second positive bus bar 22 is connected to the positive terminals 12p of the second semiconductor modules 12. The second negative bus bar 32 is connected to the negative terminals 12n of the second semiconductor modules 12. Specifically, the positive terminals 11p and the negative terminals 11n of the first semiconductor modules 11 are joined to the first positive bus bar 21, as located on an upper side of the positive bus bar stack 20, and the first negative bus bar 31, as located on an upper side of the negative bus bar stack 20. Similarly, the positive terminals 12p and the negative terminal 12n of the second semiconductor modules 12 are connected to the second positive bus bar 22, as located on a lower side of the positive bus bar stack 20, and the second negative bus bar 32, as located on a lower side of the negative bus bar stack 20. Therefore, the distance d1 between the positive connecting terminals 211 of the first positive bus bar 21 and the negative connecting terminals 311 of the first negative bus bar 31 of the first semiconductor modules 11 in the stacking direction Z of the positive bus bar stack 20 and the negative bus bar stack 30 is, as clearly illustrated in FIGS. 15 and 16, identical with the distance d2 between the positive connecting terminals 221 of the second positive bus bar 22 and the negative connecting terminals 321 of the second negative bus bar 32 of the second semiconductor modules 12 in the stacking direction Z of the positive bus bar stack 20 and the negative bus bar stack 30. This results in a decreased difference between the mutual inductance in the first semiconductor modules 11 and that in the second semiconductor modules 12. In other words, a variation in mutual inductance among the semiconductor modules (i.e., the first semiconductor modules 11 and the second semiconductor modules 12) will be decreased, thereby decreasing the overall inductance of the power converter.

Figure 15:
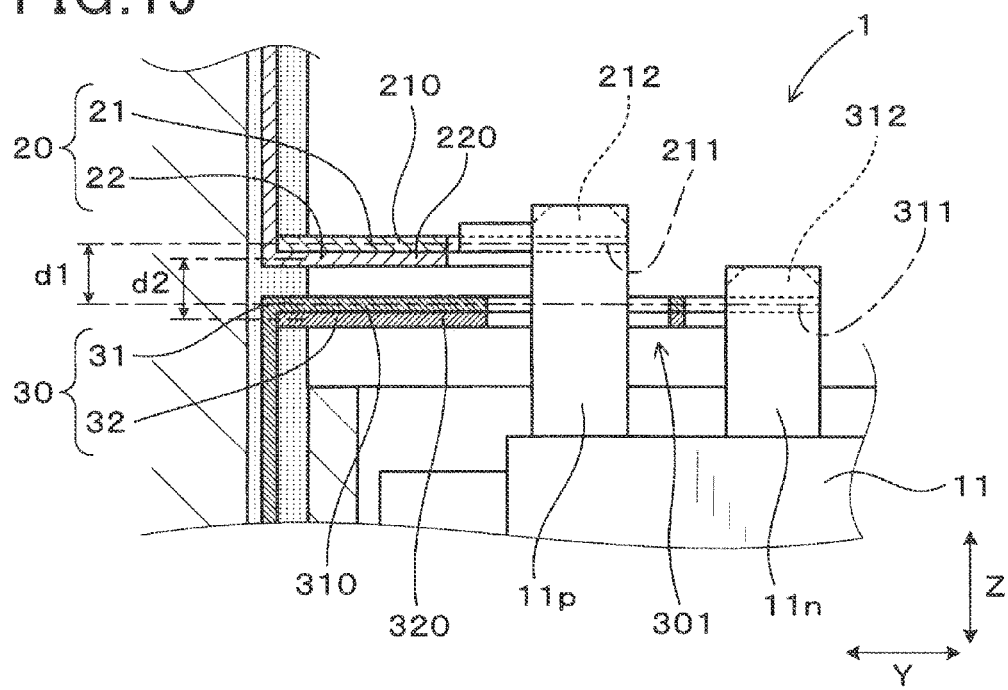
FIG. 15 is a partially enlarged sectional view, as taken along the line XV-XV in FIG. 2.
Figure 16:
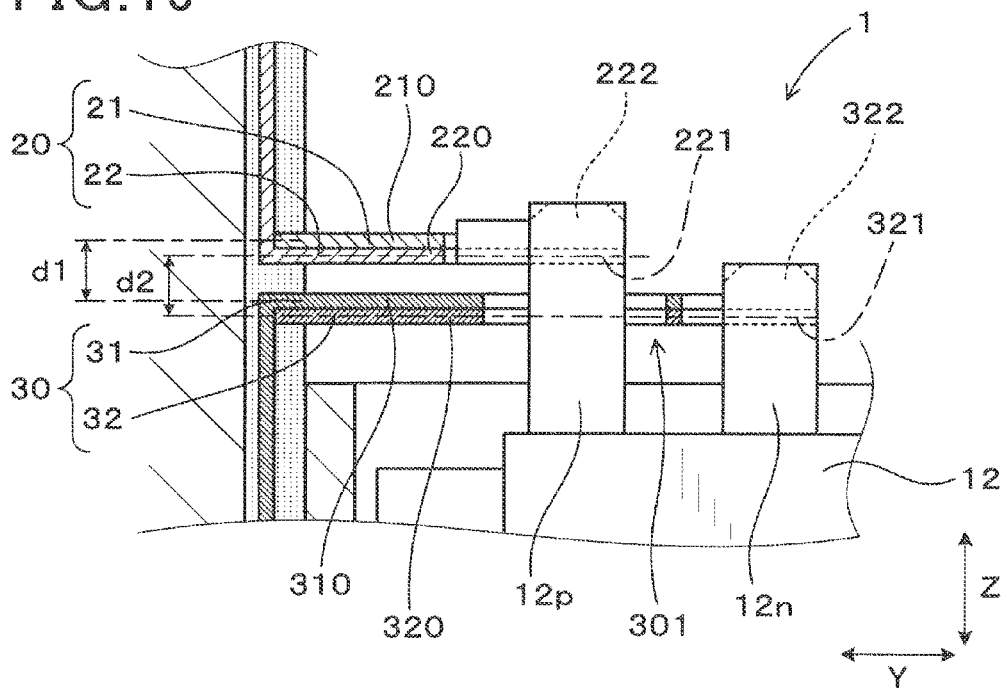
FIG. 16 is a partially enlarged sectional view, as taken along the line XVI-XVI in FIG. 2.

In this embodiment, the distance between the positive bus bar body 210 of the first positive bus bar 21 and the negative bus bar body 310 of the first negative bus bar 31 in the direction Z of the positive bus bar stack 20 and the negative bus bar stack 30 is, as illustrated in FIGS. 15 and 16, identical with the distance between the positive bus bar body 220 of the second positive bus bar 22 and the negative bus bar body 320 of the second negative bus bar 32 in the direction Z of the positive bus bar stack 20 and the negative bus bar stack 30. In other words, the distance d1 is equal to the distance d2, as described above. This equalizes the effect of the mutual inductance among the semiconductor modules (i.e., the first semiconductor modules 11 and the second semiconductor modules 12), thus resulting in a further decrease in overall inductance of the power converter.

The plurality of positive connecting terminals 211 and 221 and the plurality of negative connecting terminals 311 and 321 have the bent ends 212, 222, 312, and 322 which are formed to be folded in parallel to the extending direction Z of the positive terminals 11p and 12p and the negative terminals 11n and 12n. The bent ends 212, 222, 312, and 322 are laid to overlap the positive terminals 11p and 12p and the negative terminals 11n and 12n in connection therewith. One of the bent ends 212 of the first positive bus bar 21 of the positive bus bar stack 20 is disposed adjacent at least one (two in this embodiment) of the bent ends 222 of the second positive bus bar 22. Additionally, one of the bent ends 312 of the first negative bus bar 31 of the negative bus bar stack 30 is disposed adjacent at least one (two in this embodiment) of the bent ends 322 of the second negative bus bar 32. This ensures sufficient distance W1 between one of the bent ends 212 of the first positive bus bar 21 of the positive bus bar stack 20 and adjacent ones of the bent ends 212 and the positive connecting terminals 221. This permits the bent ends 212 to be widened. Similarly, the first negative bus bar 31 and the second negative bus bar 32 of the second positive bus bar 22 are also designed to have the sufficient distances W2, W3, and W4, thus permitting the bent ends 222, 312, and 322 to be widened.

Each of the positive bus bar stack 20 and the negative bus bar stack 30 is made up of two layers: bus bars (21 and 22 or 31 and 32), but the number of overlapped layers of the positive bus bar stack 30 and the negative bus bar stack 30 may be further increased. For instance, the positive bus bar stack 20 may alternatively have a third positive bus bar laid on a combination of the first positive bus bar 21 and the second positive bus bar 22 in the direction Z. The negative bus bar stack 30 may also have a third negative bus bar laid on a combination of the first negative bus bar 31 and the second negative bus bar 32 in the direction Z. In this case, the semiconductor module stack 10 is engineered to have a stack of third semiconductor modules connected to the third positive bus bar and the third negative bus bar in addition to the first semiconductor modules 11 and the second semiconductor modules 12. This structure also reduces a variation in effect of the mutual inductance among the semiconductor modules, thereby decreasing the overall inductance of the power converter.

(Second Embodiment)

Next, the power converter 1 of the second embodiment will be described below using FIGS. 17 to 29.

Figure 17:
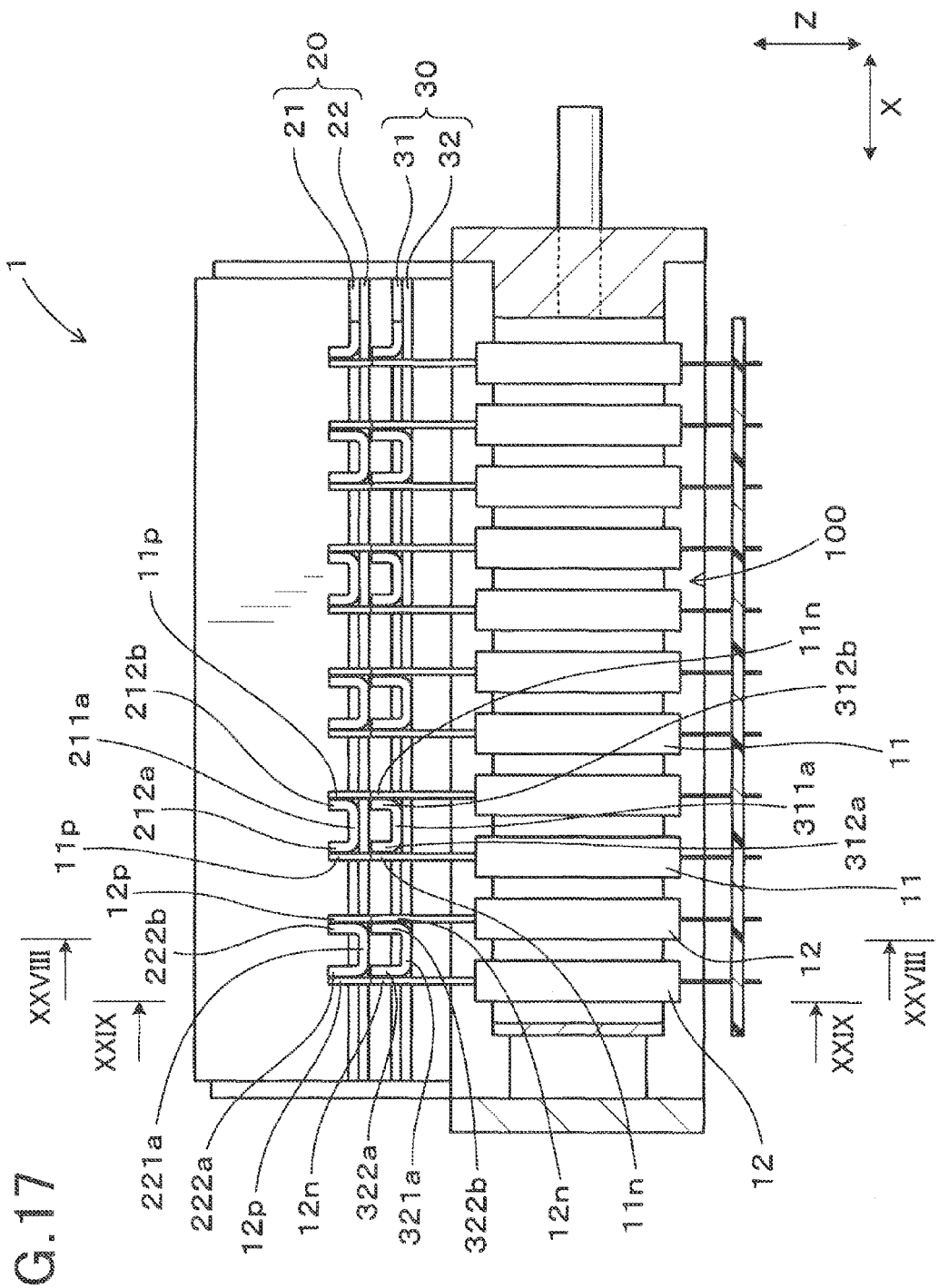
FIG. 17 is a sectional view of a power converter in the second embodiment.

The power converter 1 of this embodiment is equipped with the semiconductor module stack 100, as illustrated in FIG. 17, instead of the semiconductor module stack 10 of the first embodiment (FIG. 2). The power converter 1 also includes, as illustrated in FIG. 17, positive connecting terminals 211a and 221a and bent ends 212a, 212b, 222a, and 222b instead of a portion of the positive connecting terminals 211 and 221 and the bent ends 212 and 222 of the first embodiment (FIG. 2). The power converter also includes, as illustrated in FIG. 17, negative connecting terminals 311a and 321a and bent ends 312a, 312b, 322a, and 322b instead of a portion of the negative connecting terminals 311 and 321 and the bent ends 312 and 322 of the first embodiment (FIG. 2). Other arrangements are identical with those in the first embodiment. The same reference numbers as employed in the first embodiment will refer to the same parts, and explanation thereof in detail will be omitted here.

The semiconductor module stack 100 has the first semiconductor modules 11 and the second semiconductor modules 12 laid over each other in the direction X with all the positive terminals 11p and 12p and the negative terminals 11n and 12n being oriented in the extending direction Z. The semiconductor module stack 10 of the first embodiment (FIG. 2) is designed to have the first semiconductor modules 11 and the second semiconductor modules 12 arranged alternately, while the semiconductor module stack 100 has pairs of the first semiconductor modules 11 and pairs of the second semiconductor modules 12 arranged alternately.

Figure 18:
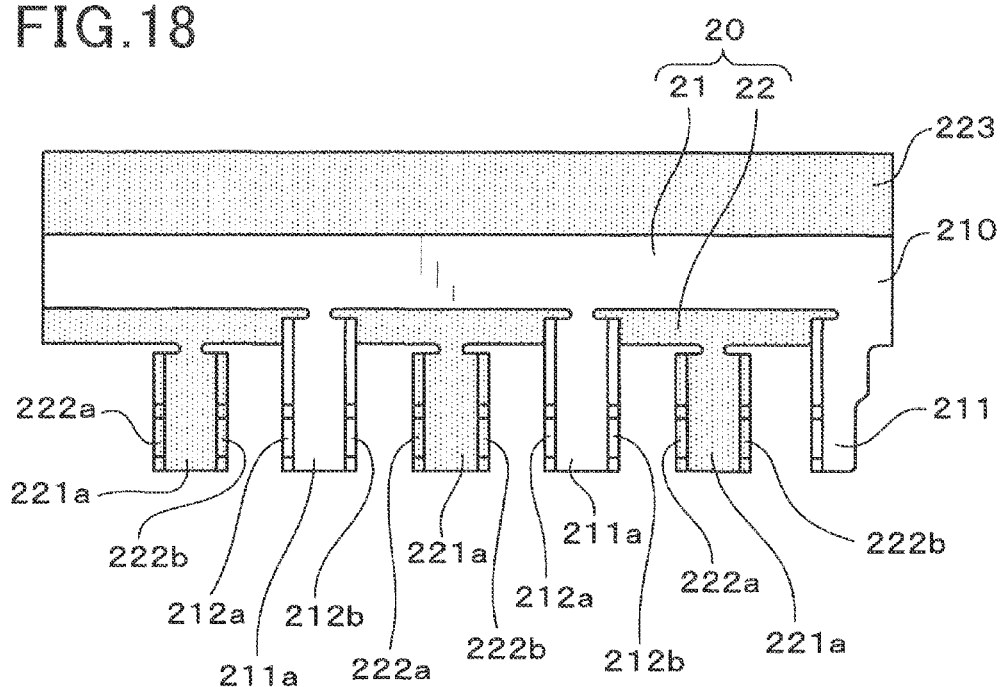
FIG. 18 is a perspective view of a positive bus bar stack in the second embodiment.
Figure 19:
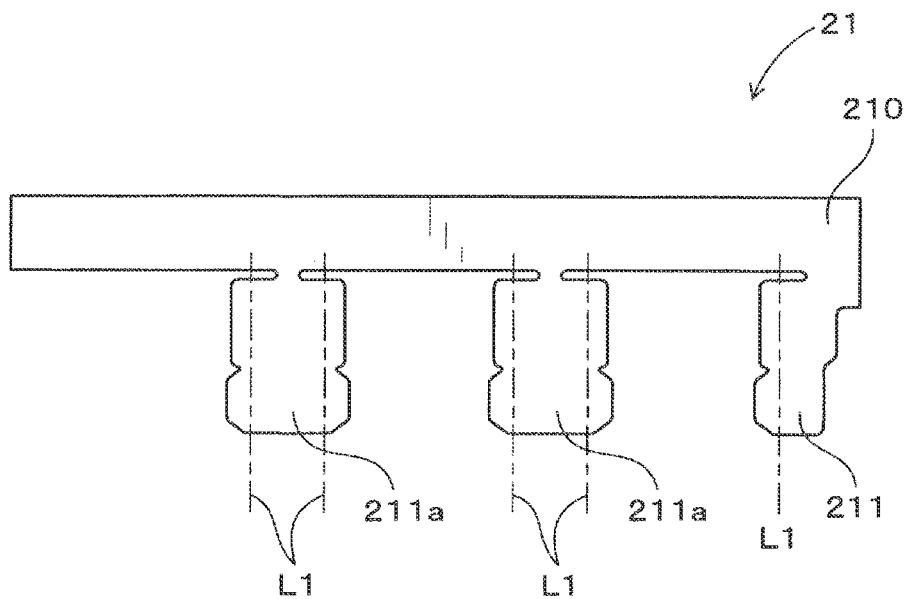
FIG. 19 is a plane view of a first positive bus bar before positive connecting terminals are bent in the second embodiment.

The first positive bus bar 21 is, as illustrated in FIGS. 18 and 19, equipped with a plurality of positive connecting terminals 211a and 211 which extend from the positive bus bar body 210 to connect with the positive terminals 11p of the semiconductor modules 11 (FIG. 17).

Figure 20:
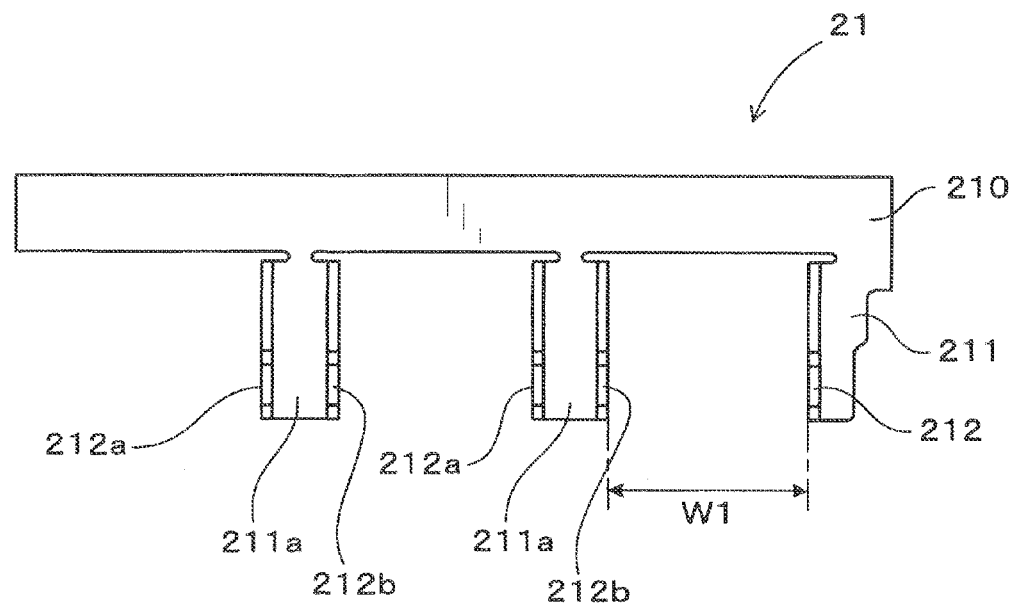
FIG. 20 is a plane view of the first positive bus bar after the positive connecting terminals are bent in FIG. 19.

The positive connecting terminals 211a and 211 extend from the long side of the positive bus bar body 210 in the direction Y perpendicular to the directions X and Z and are equally spaced from each other. This embodiment is equipped with the two positive connecting terminals 211a and the one positive connecting terminal 211. The positive connecting terminals 211a are bent at locations, as indicated by broken lines L1 in FIG. 19 extending parallel to the direction Y, so as to extend parallel to the direction Z in FIG. 17 away from the semiconductor module stack 100, thereby forming, as illustrated in FIG. 20, bent ends 212a and 212b on each of the positive connecting terminals 211a which extend in the direction Z in addition to the bent end 212 of the positive connecting terminal 211. Each of the bent ends 212a and 212b is, as illustrated in FIG. 20, spaced away from the adjacent bent end 212, 212, or 212b and the adjacent positive connecting terminal 211a or 211 by a distance W1.

Figure 21:
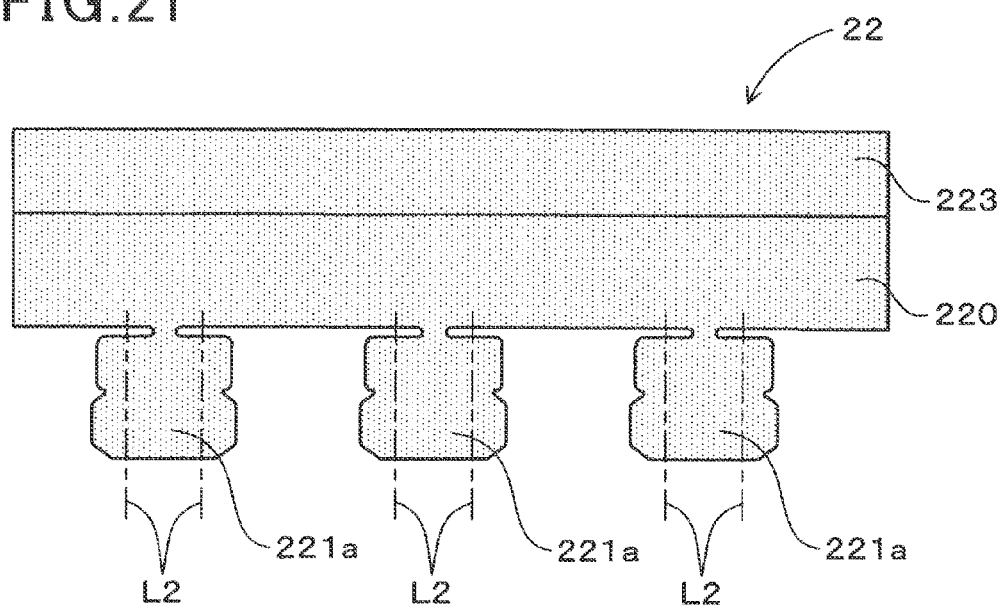
FIG. 21 is a plane view of a second positive bus bar before positive connecting terminals are bent in the second embodiment.

The second positive bus bar 22 is, as illustrated in FIGS. 18 and 21, equipped with a plurality of positive connecting terminals 221a which extend from the positive bus bar body 220 to connect with the positive terminals 12p of the second semiconductor modules 12 (FIG. 17).

Figure 22:
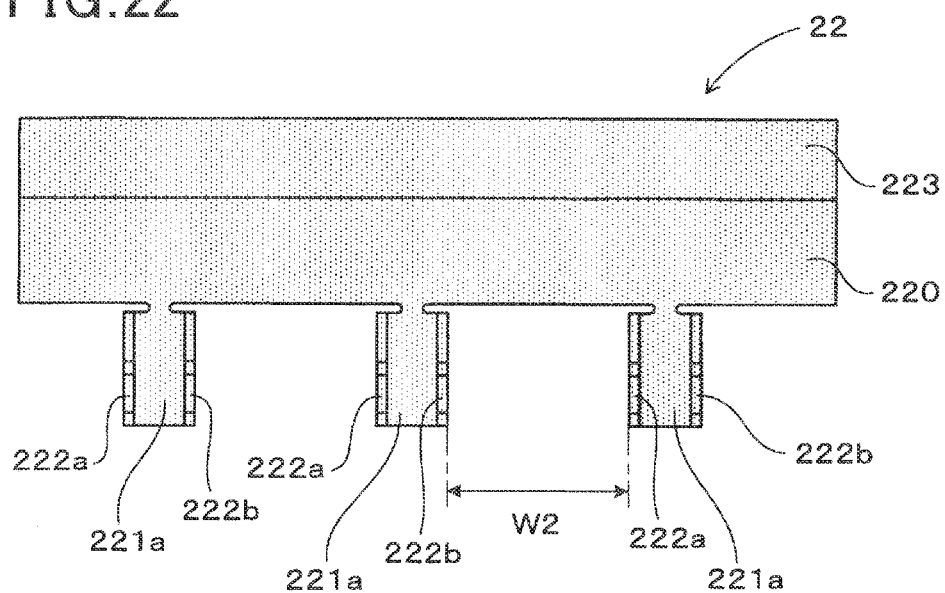
FIG. 22 is a plane view of the second positive bus bar after the positive connecting terminals are bent in FIG. 21.

The positive connecting terminals 221a, like the positive connecting terminals 211 (FIG. 6), extend from the long side of the positive bus bar body 220 in the direction Y and are equally spaced from each other in the direction X. This embodiment is equipped with the three positive connecting terminals 211a. The positive connecting terminals 211a are, as illustrated in FIGS. 17 and 22, bent parallel to the direction Z at locations, as indicated by broken lines L2 in FIG. 21, away from the semiconductor module stack 10, thereby forming bent ends 222a and 222b on each of the positive connecting terminals 221a which extend in the direction Z. Each of the bent ends 222a and 222b is, as illustrated in FIG. 22, spaced away from the adjacent bent end 222a or 222b and the adjacent positive connecting terminal 221a by a distance W2.

The positive connecting terminals 211a and 211 and the positive connecting terminals 221a are, as shown in FIG. 18, arranged alternately in the direction X and do not overlap each other, as viewed from the direction Z. This causes one of the bent ends 212a or 212b of the first positive bus bar 21 of the positive bus bar stack 20 to be, as illustrated in FIG. 18, disposed next to at least one of the bent ends 222a or 222b of the second positive bus bar 22 (i.e., the bent end 222a or 222b disposed adjacent in the direction X in this embodiment). This, like in the first embodiment, ensures, as illustrated in FIG. 20, the sufficient distance W1 between the bent end 212a or 212b of the first positive bus bar 21 of the positive bus bar stack 20 and the adjacent bent end 212a, 212, or 212b. This permits the bent ends 212a, 212b, and 212 to be widened. Similarly, the second positive bus bar 22, as illustrated in FIG. 22, ensures the sufficient distance W2, thus permitting the bent ends 222a and 222b to be widened.

Figure 23:
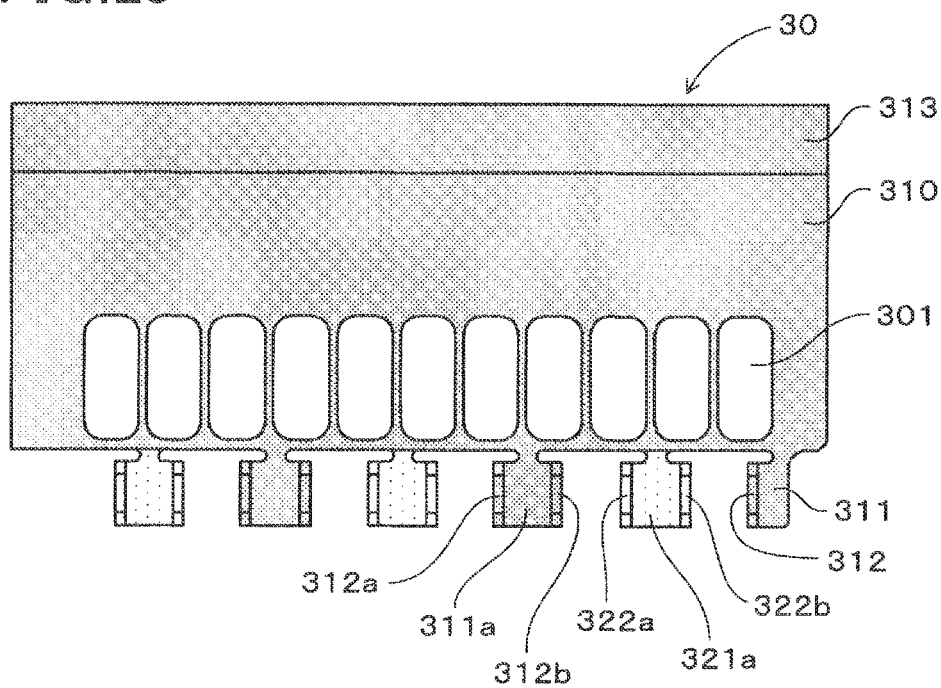
FIG. 23 is a top view of a negative bus bar stack in the second embodiment.
Figure 24:
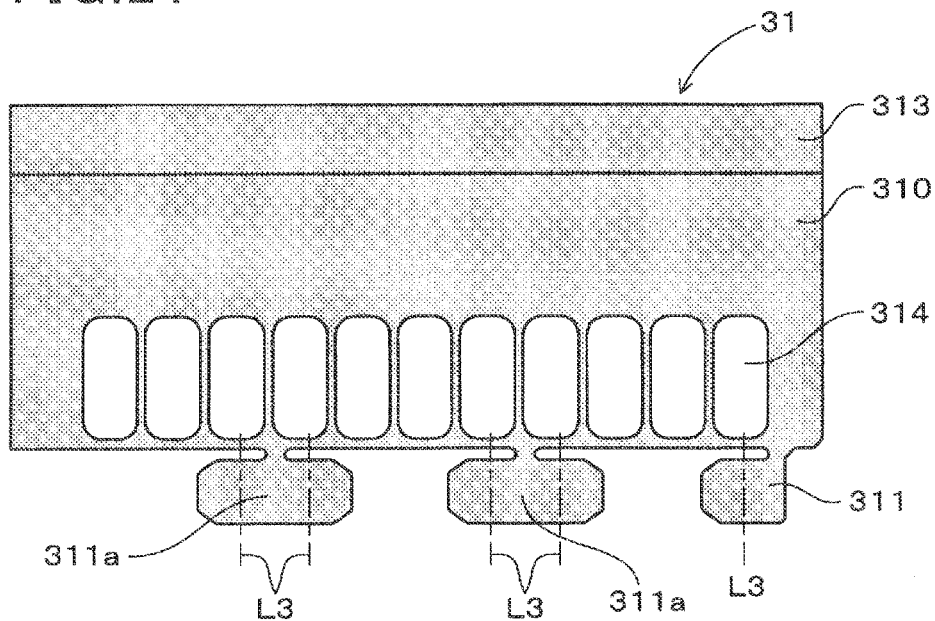
FIG. 24 is a plane view of a first negative bus bar before negative connecting terminals are bent in the second embodiment.

The first negative bus bar 31 is, as illustrated in FIGS. 23 and 24, equipped with a plurality of negative connecting terminals 321a and 311 which extend from the negative bus bar body 310 to connect with the negative terminals 11n of the semiconductor modules 11 (FIG. 17).

Figure 25:
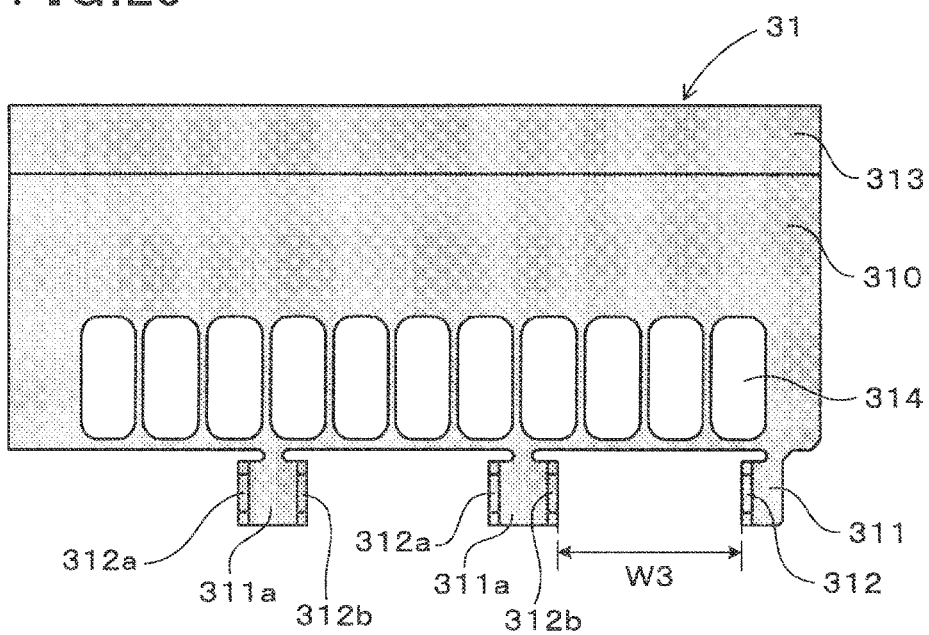
FIG. 25 is a plane view of the first negative bus bar after the negative connecting terminals are bent in FIG. 24.

The negative connecting terminals 311a and 311 extend from the long side of the positive bus bar body 310 in the direction Y perpendicular to the directions X and Z and are equally spaced from each other in the direction X. This embodiment is equipped with the two negative connecting terminals 311a and the one negative connecting terminal 311. The negative connecting terminals 311a are bent parallel to the direction Z in FIG. 17 at locations, as indicated by broken lines L3 in FIG. 24, away from the semiconductor module stack 10, thereby forming, as illustrated in FIG. 25, bent ends 312a and 312b on each of the negative connecting terminals 321a which extend in the direction Z in addition to the bent end 312 of the negative connecting terminal 311. Each of the bent ends 312a and 312b is, as illustrated in FIG. 25, spaced away from the adjacent bent end 312a, 312, or 312b and the adjacent negative connecting terminal 311a or 311 by a distance W3.

Figure 26:
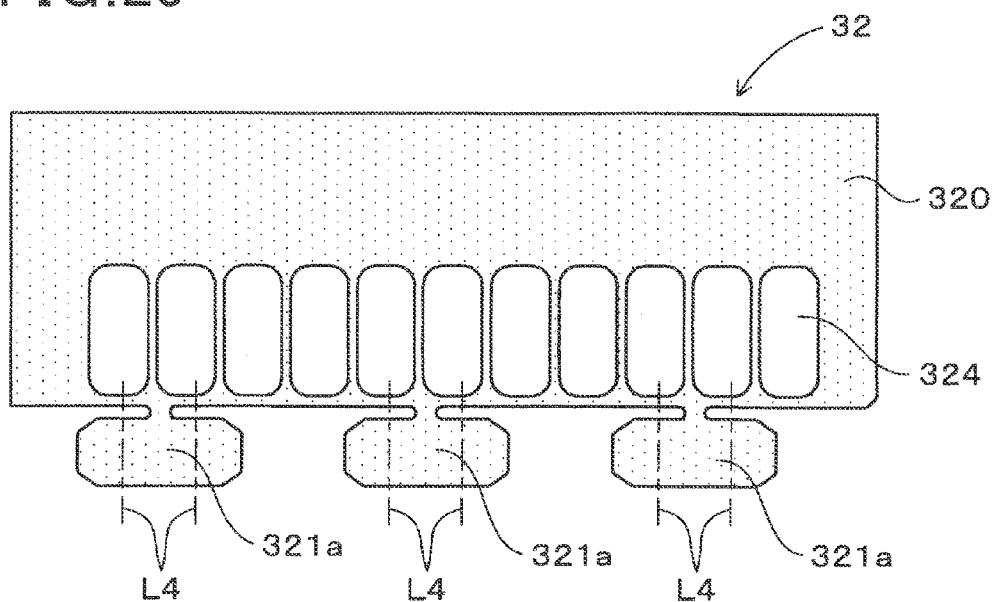
FIG. 26 is a plane view of a second negative bus bar before negative connecting terminals are bent in the second embodiment.

The second negative bus bar 22 is, as illustrated in FIGS. 18 and 26, equipped with a plurality of positive connecting terminals 321a which extend from the negative bus bar body 320 to connect with the negative terminals 12n of the second semiconductor modules 12 (FIG. 17).

Figure 27:
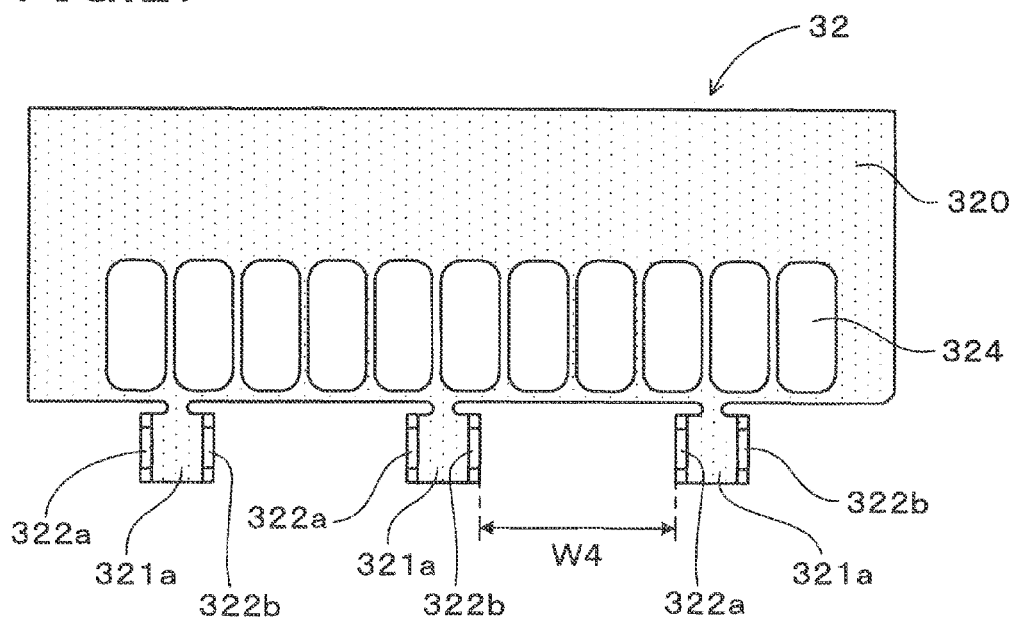
FIG. 27 is a plane view of the second negative bus bar after the negative connecting terminals are bent in FIG. 26.

The negative connecting terminals 321a, like the negative connecting terminals 321 (FIG. 10), extend from the long side of the negative bus bar body 320 in the direction Y and are equally spaced from each other in the direction X. This embodiment is equipped with the three negative connecting terminals 321a. The negative connecting terminals 321a are, as illustrated in FIGS. 17 and 27, bent parallel to the direction Z at locations, as indicated by broken lines L4 in FIG. 26, away from the semiconductor module stack 10, thereby forming on each of the negative connecting terminals 321a bent ends 322a and 322b which extend in the direction Z. Each of the bent ends 322a and 322b is, as illustrated in FIG. 27, spaced away from the adjacent bent end 322a or 322b and the adjacent positive connecting terminal 321a by a distance W4.

The negative connecting terminals 311a and 311 and the negative connecting terminals 221a are, as shown in FIG. 23, arranged alternately in the direction X and do not overlap each other, as viewed from the direction Z. This causes one of the bent ends 312a or 312b of the first negative bus bar 31 of the negative bus bar stack 30 to be, as illustrated in FIG. 23, disposed next to at least one of the bent ends 322a or 322b of the second negative bus bar 32 (i.e., the bent end 322a or 322b disposed adjacent in the direction X in this embodiment).

This, like in the first embodiment, ensures the sufficient distance W3 between the bent end 312a or 312b of the first negative bus bar 31 of the negative bus bar stack 30 and the adjacent bent end 312a, 312, or 312b. This permits the bent ends 312a and 312b to be widened. Similarly, the second negative bus bar 32 ensures the sufficient distance W4, thus permitting the bent ends 322a and 322b to be widened.

Figure 28:
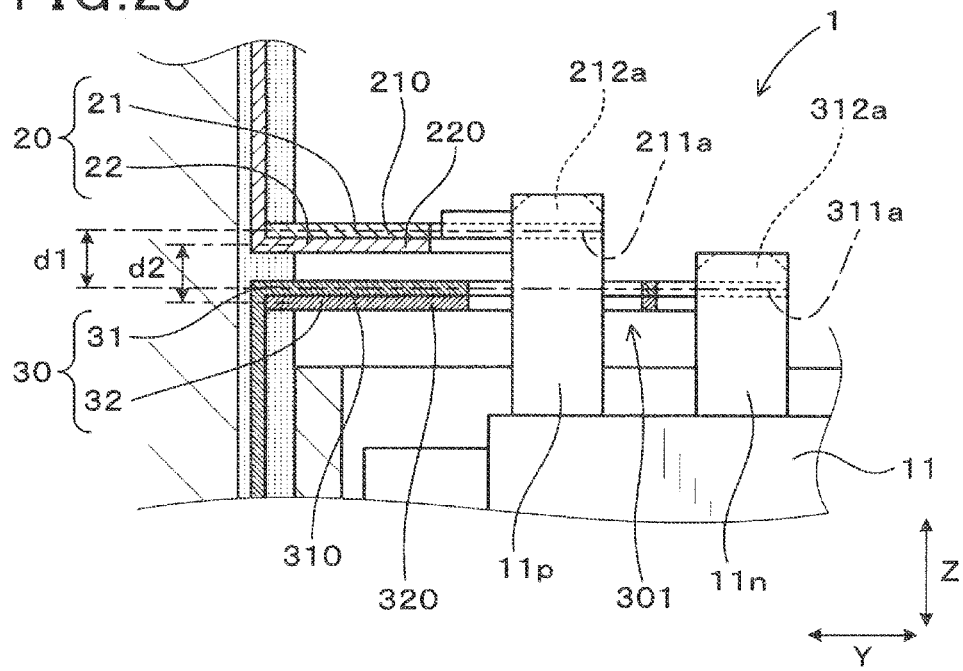
FIG. 28 is a partially enlarged sectional view, as taken along the line XXVIII-XXVIII in FIG. 17.
Figure 29:
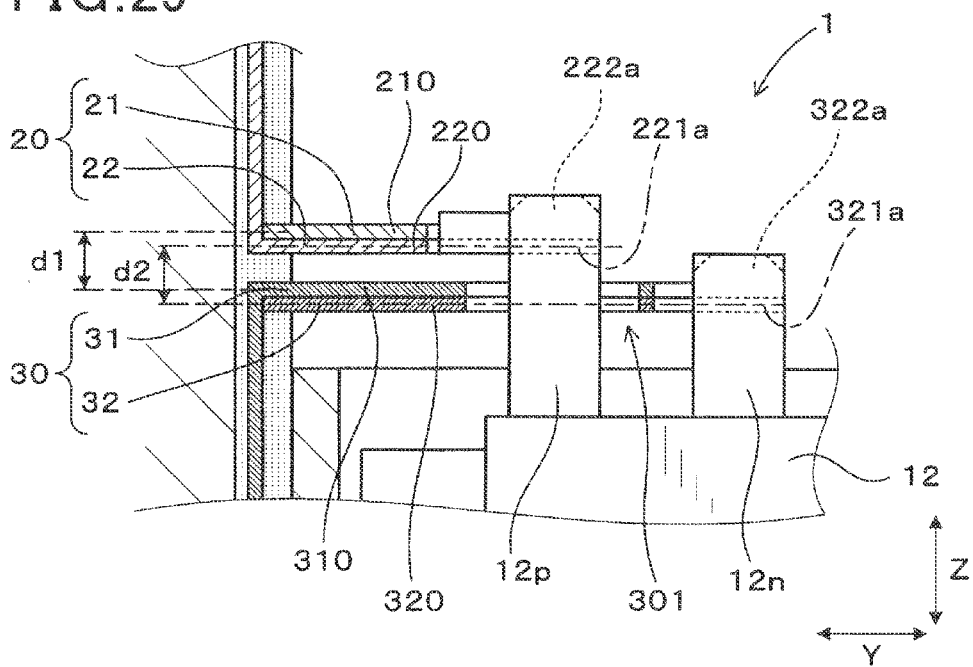
FIG. 29 is a partially enlarged sectional view, as taken along the line XXIX-XXIX in FIG. 17.

The power converter 1 of this embodiment, like in the first embodiment, is designed so that the distance d1 between the positive connecting terminals 211a of the first positive bus bar 21 and the negative connecting terminals 311a of the first negative bus bar 31 of the first semiconductor modules 11 is, as clearly illustrated in FIGS. 28 and 29, identical with the distance d2 between the positive connecting terminals 221a of the second positive bus bar 22 and the negative connecting terminals 321a of the second negative bus bar 32 of the second semiconductor modules 12. This equalizes the effect of the mutual inductance among the semiconductor modules (i.e., the first semiconductor modules 11 and the second semiconductor modules 12), thus resulting in a further decrease in overall inductance of the power converter 1. The power converter 1 of the second embodiment offers the same functional effects as those in the first embodiment.

What is claimed is:

1. A power converter comprising:
   a semiconductor module stack made up a plurality of semiconductor modules constituting a portion of a power converting circuit;
   a positive bus bar stack made up of a plurality of positive bus bars which include plate-like positive bus bar bodies and a plurality of positive connecting terminals extending from the positive bus bar bodies to connect with positive terminals of said semiconductor modules, the positive bus bar bodies being laid on each other; and
   a negative bus bar stack made up of a plurality of negative bus bars which include plate-like negative bus bar bodies and a plurality of negative connecting terminals extending from the negative bus bar bodies to connect with negative terminals of said semiconductor modules, the negative bus bar bodies being laid on each other,
   wherein the plurality of semiconductor modules of the semiconductor module stack include first semiconductor modules and second semiconductor modules, respectively, which are stacked with extending directions of the positive terminals and the negative terminals being identical with each other,
   wherein the positive bus bars of the positive bus bar stack include a first positive bus bar and a second positive bus bar, major bodies of the first positive bus bar and the second positive bus bar have respective thicknesses, the first semiconductor modules and the second semiconductor models have respective thicknesses, the thicknesses of the major bodies of the first positive bus bar and the second positive bus bar being stacked in a direction perpendicular to a stacking direction in which the thicknesses of the first semiconductor modules and the second semiconductor modules are stacked;
   wherein the negative bus bars of the negative bus bar stack include a first negative bus bar and a second negative bus bar, major bodies of the first negative bus bar and the second negative bus bar have respective thicknesses, the thicknesses of the major bodies of the first negative bus bar and the second negative bus bar being stacked in the stacking direction of the first positive bus bar and the second positive bus bar, and
   wherein the first semiconductor modules are connected to the first positive bus bar and the first negative bus bar, the second semiconductor modules being connected to the second positive bus bar and the second negative bus bar.

2. A power converter as set forth in claim 1, wherein the plurality of positive connecting terminals and the plurality of negative connecting terminals are equipped with bent ends which are respectively bent parallel to the extending direction of the positive terminals and the negative terminals and laid on the positive terminals and the negative terminals in connection therewith, wherein one of the bent ends of the first positive bus bar of the positive bus bar stack is disposed adjacent at least one of the bent ends of the second positive bus bar, and wherein one of the bent ends of the first negative bus bar of the negative bus bar stack is disposed adjacent at least one of the bent ends of the second negative bus bar.

3. A power converter as set forth in claim 1, wherein a distance between the positive bus bar body of the first positive bus bar and the negative bus bar body of the first negative bus bar is identical with that between the positive bus bar body of the second positive bus bar and the negative bus bar body of the second negative bus bar in the stacking direction of the positive bus bar stack and the negative bus bar stack.

* * * * *